(12) United States Patent
Deak et al.

(10) Patent No.: US 9,885,764 B2
(45) Date of Patent: Feb. 6, 2018

(54) HIGH-SENSITIVITY PUSH-PULL BRIDGE MAGNETIC SENSOR

(71) Applicant: MultiDimension Technology Co., Ltd., Zhangjiagang (CN)

(72) Inventors: James Geza Deak, Zhangjiagang (CN); Dan Li, Zhangjiagang (CN)

(73) Assignee: MultiDimension Technology Co., Ltd., Zhangjiagang (CN)

(*) Notice: Subject to any disclaimer, the term of this patent is extended or adjusted under 35 U.S.C. 154(b) by 0 days.

(21) Appl. No.: 15/108,172

(22) PCT Filed: Dec. 24, 2014

(86) PCT No.: PCT/CN2014/094796
§ 371 (c)(1),
(2) Date: Jun. 24, 2016

(87) PCT Pub. No.: WO2015/096731
PCT Pub. Date: Jul. 2, 2015

(65) Prior Publication Data
US 2016/0327617 A1    Nov. 10, 2016

(30) Foreign Application Priority Data
Dec. 24, 2013 (CN) .......................... 2013 1 0718969

(51) Int. Cl.
*G01R 33/02* (2006.01)
*G01R 33/09* (2006.01)
*G01R 33/00* (2006.01)

(52) U.S. Cl.
CPC ........ *G01R 33/091* (2013.01); *G01R 33/0011* (2013.01); *G01R 33/09* (2013.01); *G01R 33/096* (2013.01)

(58) Field of Classification Search
CPC ........................ G01R 33/09; G01R 33/0011
(Continued)

(56) References Cited

U.S. PATENT DOCUMENTS

| 7,915,890 B2 | 3/2011 | Bonin |
| 8,395,381 B2 | 3/2013 | Lo et al. |

(Continued)

FOREIGN PATENT DOCUMENTS

| CN | 102226836 A | 10/2011 |
| CN | 102298125 | 12/2011 |

(Continued)

OTHER PUBLICATIONS

"International Application No. PCT/CN2014/094796, International Search Report and Written Opinion dated Apr. 3, 2015", (Apr. 3, 2015), 12 pgs.

*Primary Examiner* — Reena Aurora
(74) *Attorney, Agent, or Firm* — Schwegman Lundberg & Woessner, P.A.

(57) ABSTRACT

A high sensitivity push-pull bridge magnetic sensor, wherein the sensor comprises two substrates, magnetoresistive sense elements, push-arm flux concentrators, and pull-arm flux concentrators, wherein the magnetization directions of the pinning layers of the magnetoresistive sense elements on the same substrate are the same, but are opposite to the magnetization directions of the pinning layers of the magnetoresistive sense elements on the adjacent substrate, and the magnetoresistive sense elements on one substrate are electrically interconnected to form a push-arm of the bridge, and the magnetoresistive sense elements on the other substrate are electrically interconnected to form a pull-arm of the bridge. The magnetoresistive sense elements on the push-arm and pull-arm are aligned respectively in the gaps between two adjacent push-arm flux concentrators and two adjacent pull-arm flux concentrators. This sensor can be implemented as a quasi-bridge structure, a half-bridge structure, or a full-bridge structure. The sensor has the advantages (Continued)

of small offset, high sensitivity, excellent linearity, and low noise.

14 Claims, 3 Drawing Sheets

(58) Field of Classification Search
USPC .......................................................... 324/252
See application file for complete search history.

(56) References Cited

U.S. PATENT DOCUMENTS

| | | | | |
|---|---|---|---|---|
| 2004/0137275 | A1* | 7/2004 | Jander | B82Y 25/00 |
| | | | | 428/811.5 |
| 2009/0309580 | A1* | 12/2009 | Dmytriw | G01R 33/09 |
| | | | | 324/207.21 |
| 2013/0300409 | A1* | 11/2013 | Deak | G01R 33/093 |
| | | | | 324/252 |

FOREIGN PATENT DOCUMENTS

| | | |
|---|---|---|
| CN | 202210144 U | 5/2012 |
| CN | 103412269 | 11/2013 |
| CN | 103630855 | 3/2014 |
| CN | 203658562 | 6/2014 |
| WO | WO-2015096731 | 7/2015 |

\* cited by examiner

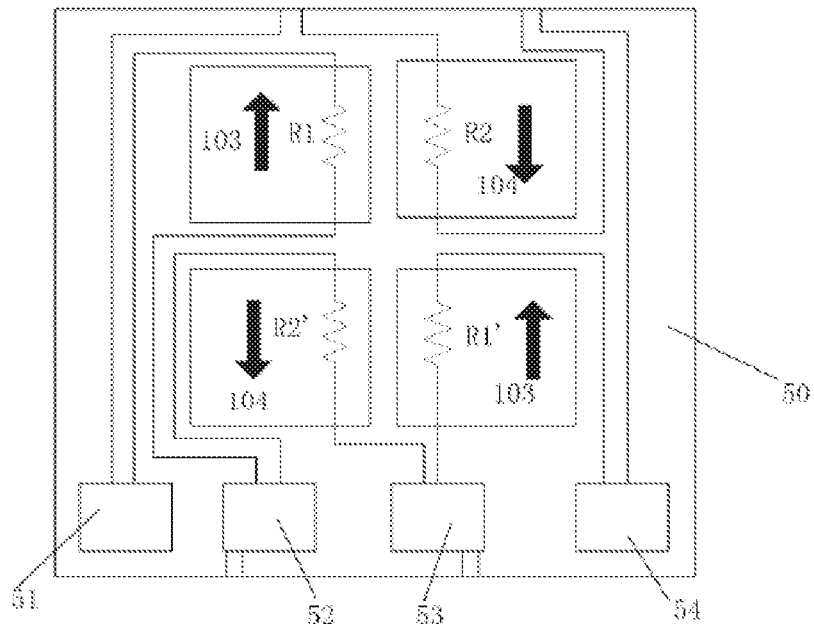
Fig. 1    --PRIOR ART--
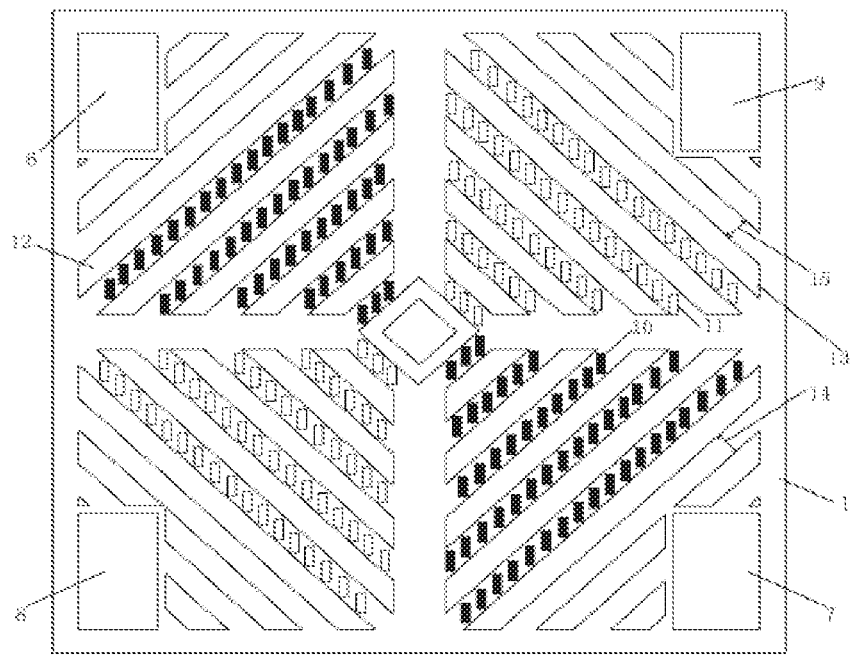
Fig. 2    --PRIOR ART--

HIGH-SENSITIVITY PUSH-PULL BRIDGE MAGNETIC SENSOR

PRIORITY CLAIM TO RELATED APPLICATIONS

This application is a U.S. national stage application filed under 35 U.S.C. § 371 from International Application Serial No. PCT/CN2014/094796, which was filed 24 Dec. 2014, and published as WO2015/096731 on 2Jul. 2015, and which claims priority to Chinese Application No. 201310718969.8, filed 24 Dec. 2013, which applications and publication are incorporated by reference as if reproduced herein and made a part hereof in their entirety, and the benefit of priority of each of which is claimed herein.

FIELD OF THE INVENTION

The present invention relates to the technical field of magnetic sensors, in particular to a high-sensitivity push-pull bridge magnetic sensor.

BACKGROUND OF THE INVENTION

Magnetic sensors are widely applied to modern industry and electronic products to sense magnetic field intensity to measure physical parameters such as current, position and direction. In the prior art, there are many different types of sensors which are used for measuring magnetic fields and other parameters, such as magnetic sensors using Hall elements, Anisotropic Magnetoresistance (AMR) elements, or Giant Magnetoresistance (GMR) elements as sense elements.

Although Hall magnetic sensors are applicable to high-intensity magnetic fields, the Hall magnetic sensors have very low sensitivity, great power consumption and poor linearity. Although AMR magnetic sensors are more sensitive than the Hall sensors, the AMR magnetic sensors are complex in manufacturing process and are high in power consumption. Although GMR magnetic sensors have higher sensitivity than the Hall magnetic sensors, the linearity range thereof is slightly low.

Tunneling magnetoresistive (TMR) magnetic sensors are novel magnetoresistance effect sensors which have been industrially applied in recent years, utilize a tunneling magnetoresistance effect of a magnetic multilayer film material to sense magnetic fields, and have higher sensitivity, lower power consumption, better linearity and wider working range than Hall magnetic sensors, AMR magnetic sensors, and GMR magnetic sensors.

Compared with a single-resistor, or a referenced bridge magnetic sensor, push-pull bridge magnetic sensors have higher sensitivity and lower offset, and simultaneously have a temperature compensation function, thus can suppress the influence of temperature drift.

However, the sensitivity of the existing push-pull bridge magnetic sensors is not high enough and the noise is not small enough.

SUMMARY OF THE INVENTION

The purpose of the present invention is to overcome the above-mentioned problems existing in the prior art and provide a high-sensitivity push-pull bridge magnetic sensor.

In order to realize the above-mentioned technical purpose and achieve the above-mentioned technical effect, the present invention provides a high-sensitivity push-pull bridge magnetic sensor, which comprises:

a push-arm substrate and a pull-arm substrate;

at least one push-arm consisting of one or more electrically interconnected magnetoresistive sense elements and at least one pull-arm consisting of one or more electrically interconnected magnetoresistive sense elements;

at least two push-arm flux concentrators and at least two pull-arm flux concentrators;

wherein, long-axis dimensions of the push-arm flux concentrators and the pull-arm flux concentrators are aligned in a Y-axis direction, and short-axis dimensions thereof are aligned in an X-axis direction;

the magnetoresistive sense elements on the push-arm are located in the gaps between two adjacent push-arm flux concentrators, and the magnetoresistive sense elements on the pull-arm are located in the gaps between two adjacent pull-arm flux concentrators;

the push-arm and the push-arm flux concentrators are deposited on the push-arm substrate, and the pull-arm and the pull-arm flux concentrators are deposited on the pull-arm substrate;

the push-arm and the pull-arm are electrically interconnected to form a bridge;

magnetization directions of magnetic pinning layers of the magnetoresistive sense elements on the same substrate are the same, and the magnetization directions of the magnetic pinning layers of the magnetoresistive sense elements on the push-arm substrate are opposite to the magnetization directions of the magnetic pinning layers of the magnetoresistive sense elements on the pull-arm substrate;

sense directions of the magnetoresistive sense elements on the push-arm and the pull-arm are along the X-axis direction.

Preferably, at most one column of the magnetoresistance sense elements is arranged respectively in a gap between every two adjacent push-arm flux concentrators and in a gap between every two adjacent pull-arm flux concentrators.

Preferably, the magnetoresistive sense elements are GMR or TMR sense elements.

Preferably, for the push-arm substrate and the pull-arm substrate, the magnetization directions of the pinning layers of the magnetoresistive sense elements on one substrate are along an X-axis positive direction and the magnetization directions of the pinning layers of the magnetoresistive sense elements on the other substrate are along an X-axis negative direction.

Preferably, when no externally applied magnetic field exists, the magnetization directions of magnetic free layers of the magnetoresistive sense elements bias are biased using on-chip permanent magnets, on-chip coils, double-exchange interaction, shape anisotropy, or a combination of at least two of them, and directions of crossed bias fields produced by the on-chip permanent magnets and the on-chip coils, etc. are along the Y-axis direction.

Preferably, the bridge is a half-bridge, a full-bridge, or a quasi-bridge.

Preferably, the magnetoresistive sense elements on the push-arm and the pull-arm are the same in number and are mutually parallel.

Preferably, the push-arm flux concentrators and the pull-arm flux concentrators are the same in number and are mutually parallel.

Preferably, the push-arm flux concentrators and the pull-arm flux concentrators are arrays of slender bars and are composed of a material which is a soft ferromagnetic alloy, the soft ferromagnetic alloy containing one or more elements of Ni, Fe and Co.

Preferably, a gain coefficient Asns of magnetic fields at the positions of the magnetoresistive sense elements on the push-arm and the pull-arm is greater than 1.

Preferably, the push-arm substrate and the pull-arm substrate contain an integrated circuit or are connected with other substrates comprising an integrated circuit.

Preferably, the integrated circuit is CMOS (Complementary Metal Oxide Semiconductor), BiCMOS (Bipolar Complementary Metal Oxide Semiconductor), Bipolar, BCDMOS (Bipolar/CMOS/DMOS where DMOS refers to a double-diffused Metal Oxide Semiconductor) or SOI (Semiconductor On Insulator or Silicon On Insulator), the push-arm is directly deposited on top of the integrated circuit on the push-arm substrate, and the pull-arm is directly deposited on top of the integrated circuit on the pull-arm substrate.

Preferably, the substrates are ASIC chips comprising any one or more application circuits of an offset circuit, a gain circuit, a calibration circuit, a temperature compensation circuit, and a logic circuit.

Preferably, the logic circuit is a digital switching circuit or a rotation angle calculating circuit.

Compared with the prior art, the present invention has the following beneficial effects: small offset, good linearity, high sensitivity, and low noise.

DESCRIPTION OF THE DRAWINGS

In order to more clearly illustrate the technical solution in the embodiments of the present invention, the drawings which need to be used in the description of the embodiments will be simply introduced below. Obviously, the drawings described below are just some of the possible embodiments of the present invention. For one skilled in the art, other drawings can be devised according to these drawings without contributing any inventive labor.

FIG. 1 is a structural schematic diagram of a common push-pull bridge magnetic sensor in the prior art.

FIG. 2 is a structural schematic diagram of another push-pull bridge magnetic sensor in the prior art.

DETAILED DESCRIPTION OF THE EMBODIMENTS

Figure 3:
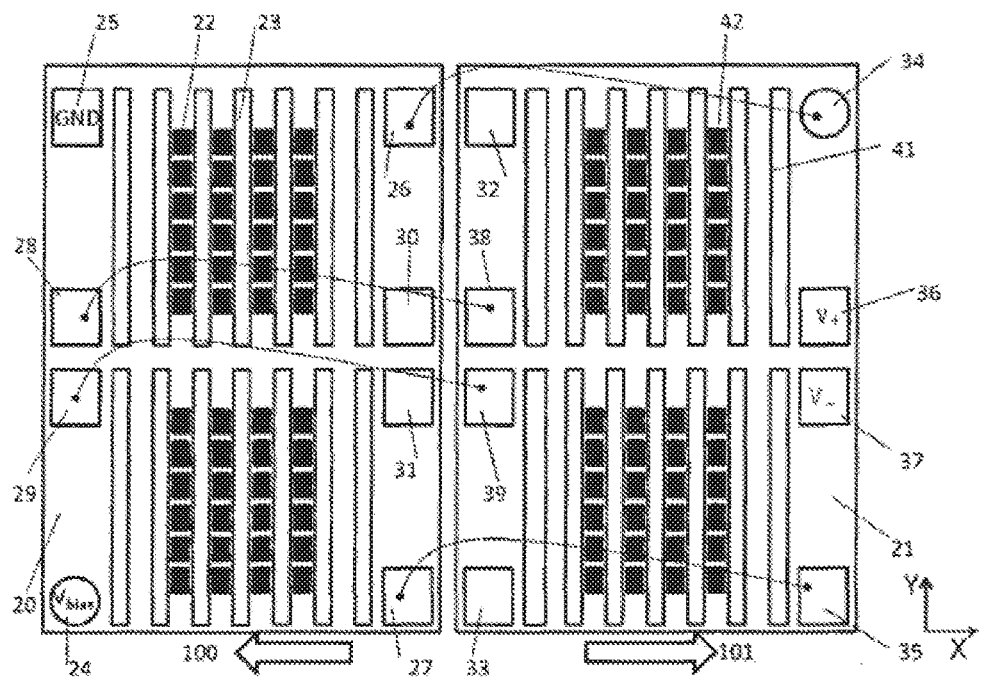
FIG. 3 is a structural schematic diagram of a push-pull bridge magnetic sensor in the present invention.

The present invention will be further described below in detail in conjunction with the drawings and the embodiments.

FIG. 1 is a structural schematic diagram of a common push-pull bridge magnetic sensor in the prior art. The structure of the sensor is a Wheatstone full-bridge consisting of GMR elements, magnetization directions of pinning layers of the GMR elements in adjacent bridge arms are opposite, and magnetization directions of pinning layers of the GMR elements in opposed bridge arms are the same, as shown by 103 and 104 in FIG. 1. The sensor comprises a substrate 50, R1, R1', R2 and R2' consisting of electrically interconnected GMR elements, pads 51-54 for input/output. The sensor adopts a double film forming process, i.e., the GMR elements which are opposite in directions of pinning layers are respectively deposited in two steps, such that the manufacturing process thereof is complex, and process annealing in the second step will influence a thin film which is deposited in the first step, consequently the consistency of the two successive film forming is poor and thereby influencing the overall performance of the sensor.

FIG. 2 is a structural schematic diagram of a single chip push-pull bridge magnetic sensor disclosed by patent application CN201310325337.5 in the prior art. The sensor comprises a substrate 1, pads 6-9 for input/output, a plurality of push-arm flux concentrators 12 and pull-arm flux concentrators 13 which are obliquely arranged on top of the substrate 1, and magnetoresistive sense elements 10 and 11 which are respectively located in the gaps 14 between two adjacent push-arm flux concentrators and the gaps 15 between two adjacent pull-arm flux concentrators. Magnetization directions of pinning layers of the magnetoresistive sense elements 10 and 11 are the same. The sensor is easily saturated and the sensitivity is not high enough.

Embodiments

FIG. 3 is a structural schematic diagram of a push-pull bridge magnetic sensor in the present invention. The sensor comprises a push-arm substrate 20, a pull-arm substrate 21, a plurality of magnetoresistive sense elements 22, 42, and a plurality of push-arm flux concentrators 23, pull-arm flux concentrators 41 and pads 24-39, wherein the magnetoresistive sense elements 22, the push-arm flux concentrators 23 and the pads 24-31 are deposited on the push-arm substrate 20, the magnetoresistive sense elements 42, the pull-arm flux concentrators 41 and the pads 32-39 are deposited on the pull-arm substrate 21, and the push-arm substrate 20 and the pull-arm substrate 21 are the same in all aspects except directions. The pads 24, 25, 36, 37 are respectively used as a power supply terminal $V_{Bias}$, a ground terminal GND and voltage outputs V+ and V−, and the pads 26-29 are respectively and electrically connected with the pads 34, 35, 38, 39. The magnetoresistance sense elements 22, 42 are respectively and electrically interconnected to form a push-arm and a pull-arm, and are respectively aligned in the gaps between two adjacent push-arm flux concentrators 23 and in the gaps between two adjacent pull-arm flux concentrators 41. At most one column of magnetoresistance sense elements are arranged respectively in a gap between every two adjacent push-arm flux concentrators 23 and a gap between every two adjacent pull-arm flux concentrators 41, each column of magnetoresistive sense elements can comprise one or at least two magnetoresistive sense elements, and in FIG. 3, each column comprises six magnetoresistive sense elements. Two push-arm flux concentrators 23 and two pull-arm flux concentrators 41 are respectively provided on upper and lower sides of peripheries of the push-arm substrate 20 and the pull-arm substrate 21, no magnetoresistive sense elements 22,42 are arranged in the gaps between them and adjacent push-arm flux concentrators 23 and adjacent pull-arm flux concentrators 41, and this is for the purpose of enabling distribution of magnetic fields at the positions of the magnetoresistive sense elements 22, 42 to be more uniform. Of course, according to the needs, more push-arm flux concentrators and/or pull-arm flux concentrators can be set to have no magnetoresistive sense elements arranged in the gaps therebetween. Preferably, these push-arm flux concentrators and/or pull-arm flux concentrators with no magnetoresistive sense elements arranged in the gaps are respectively located on outer sides and in middle of the push-arm substrate 20 and the pull-arm substrate 21. If needed, the magnetoresistive sense elements can also be arranged in the gaps of these flux concentrators. A number of the push-arm flux concentrators or pull-arm flux concentrators on each bridge arm of the bridge and a number of the columns of the magnetoresistive sense elements on the same bridge arm have a relation as follows: NC>=NS+1, wherein NC denotes number of push-arm flux concentrators or pull-arm flux concentrators, NS denotes number of columns of magnetoresistive sense elements, and in this embodiment, NC is 7 and NS is 4. If the push-arm flux concentrators 23 and the pull-arm flux concentrators 41 are arranged in rows, the magnetoresistive sense elements 22 and 42 are also respectively arranged in rows in the gaps between two adjacent push-arm flux concentrators 23 and the gaps between two adjacent pull-arm flux concentrators 41.

Magnetization directions of pinning layers of the magnetoresistive sense elements 22 on the same substrate are the same and magnetization directions of pinning layers of the magnetoresistive sense elements 42 are also the same, but the magnetization directions of the pinning layers of the magnetoresistive sense elements 22 and the magnetization directions of the pinning layers of the magnetoresistive sense elements 42 are opposite and are respectively 100 and 101. The magnetoresistive sense elements 22, 42 can be GMR or TMR sense elements, sense directions thereof are an X-axis direction, and the magnetoresistive sense elements 22, 42 are the same in number and are mutually parallel. In addition, when no externally applied magnetic field exists, the magnetoresistive sense elements 22, 42 can bias magnetization directions of magnetic free layers through on-chip permanent magnets, on-chip coils, double-exchange interaction, shape anisotropy or any combination thereof, such that the magnetization directions of the magnetic free layers are perpendicular to the magnetization directions of the pinning layers, directions of crossed bias fields produced by the on-chip permanent magnets and the on-chip coils are a Y-axis direction, and the directions of the crossed bias fields on the magnetoresistive sense elements 22 and the magnetoresistive sense elements 42 can be opposite, i.e., one is in a Y-axis positive direction, and the other is a Y-axis negative direction, and can also be the same, i.e., both are in the Y-axis positive direction or the Y-axis negative direction.

The push-arm flux concentrators 23 and the pull-arm flux concentrators 41 are the same in number and are mutually parallel, the number thereof is respectively at least two, and in FIG. 3, the number thereof on each bridge arm is seven. Long-axis directions thereof are the Y-axis direction, short-axis directions are the X-axis direction, and they are arrays of slender bars, but not limited to this shape, and a component material thereof is soft ferromagnetic alloy consisting of one or several elements of Ni, Fe and Co. The push-arm substrate 20 and the pull-arm substrate 21 can also have an integrated circuit printed thereon, or are connected with other substrates printed with an integrated circuit. Preferably, the printed integrated circuit can be CMOS, BiCMOS, Bipolar, BCDMOS or SOI. When the push-arm substrate 20 and the pull-arm substrate 21 have the integrated circuit printed thereon, the push-arm and the pull-arm can be directly deposited on tops of the integrated circuits of the corresponding substrates. Additionally, the push-arm substrate 20 and the pull-arm substrate can be ASIC substrates which can comprise any one or several application circuits of an offset circuit, a gain circuit, a calibration circuit, a temperature compensation circuit and a logic circuit, wherein the logic circuit can also be a digital switching circuit or a rotation angle calculating circuit, but is not limited to the above-mentioned circuits.

In this embodiment, pad wire bonding is adopted for input/output connection, and semiconductor package methods such as flip chip, ball grid array package, wafer level package and chip-on-board package can also be adopted.

Figure 4:
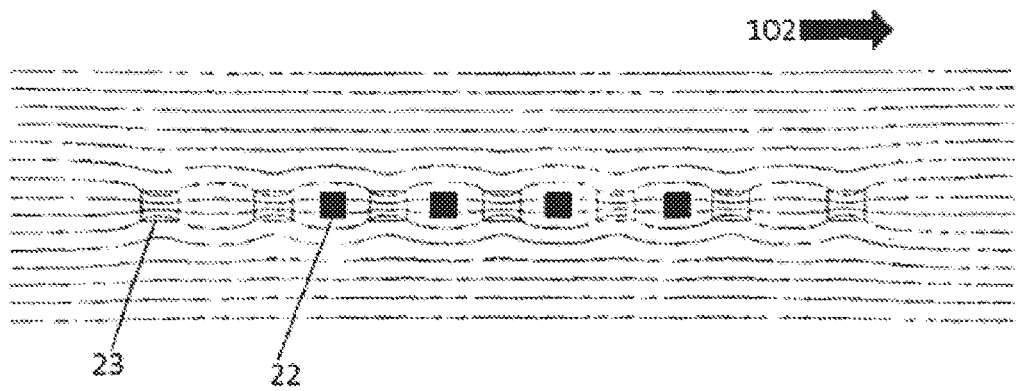
FIG. 4 is a diagram of the distribution of magnetic fields around magnetoresistive sense elements.

FIG. 4 is a distribution diagram of magnetic fields around magnetoresistive sense elements 22. In the figure, a direction of an externally applied magnetic field is 102. From the figure, it can be seen that the intensity of the magnetic fields at the positions of the gaps between two adjacent push-arm flux concentrators 23 is enhanced. The distribution of the magnetic fields around the magnetoresistive sense elements 42 is the same as that in FIG. 3 and thus is not repetitively described here.

Figure 5:
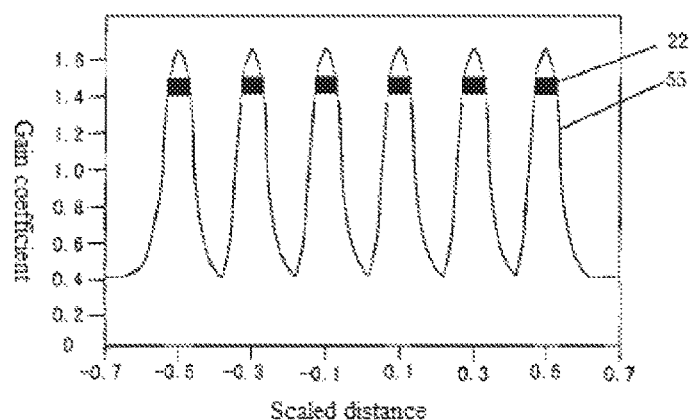
FIG. 5 plots the relationship between positions of magnetoresistive sense element and corresponding gain coefficients.

FIG. 5 is a relation curve between positions of magnetoresistive sense element 22, 42 and corresponding gain coefficients. From a curve 55 in the figure, it can be seen that a gain coefficient Asns of magnetic fields at the positions of the magnetoresistive sense elements 22, 42 is greater than 1, and accordingly, magnetic field signals detected by the magnetoresistive sense element 22, 42 are enhanced such that output signals are enhanced and the sensitivity of the sensor is thus improved.

Figure 6:
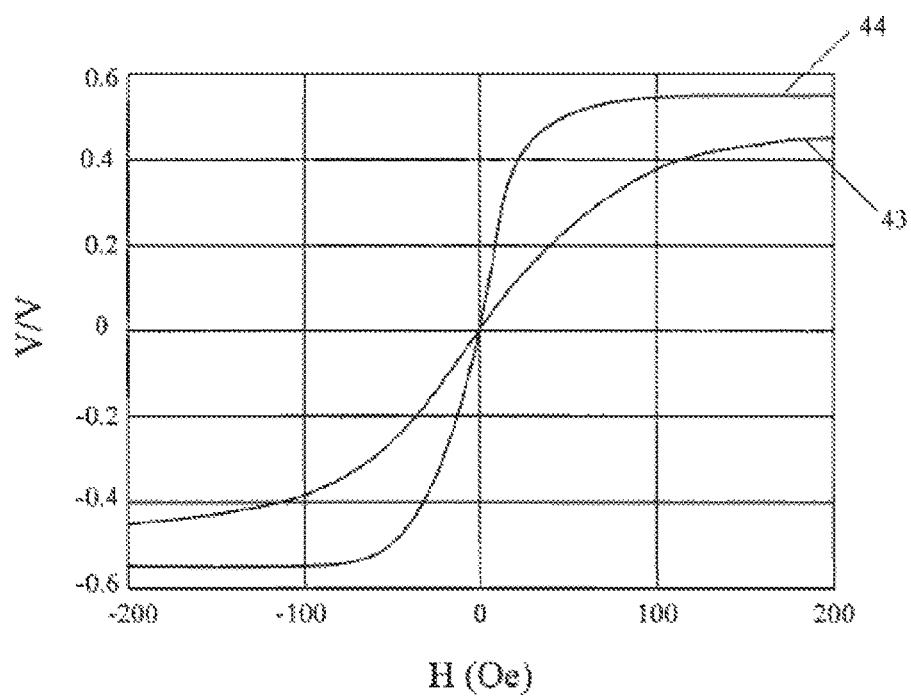
FIG. 6 compares the response of a push-pull bridge magnetic sensor of the present invention with and one without flux concentrators.

FIG. 6 is a response curve of a push-pull bridge magnetic sensor with and without flux concentrators in the present invention when the magnetoresistive sense elements are TMR sense elements. Curve 43 corresponds to a situation that no flux concentrators exist, and curve 44 corresponds to a situation that flux concentrators exist. A horizontal axis in the figure expresses a magnitude of the externally applied magnetic field, and a longitudinal axis expresses a ratio of sensor output voltage to power supply voltage. By comparing the two curves, it can be seen that, after using the flux concentrators, the linearity of the sensor is better, the sensitivity is higher, and the up-down symmetry about origins of curves is better, i.e., the offset would be smaller. In addition, since two substrates are used in the sensor in the present invention, compared with a sensor using a single substrate, the area is increased and thus the noise is reduced.

What is discussed above is the situation that the bridge is the full-bridge. Since the working principle of the half-bridge and the quasi-bridge is the same as that of the full-bridge, the working principle is not repetitively described here. The conclusions obtained above are also applicable to push-pull bridge magnetic sensors in half-bridge and quasi-bridge structures.

The embodiments described above are just preferred embodiments of the present invention and are not used for limiting the present invention. For one skilled in the art, the present invention can have various alterations and changes. Any modification, equivalent replacement, improvement and the like made within the spirit and principle of the present invention shall also be included in the protection range of the present invention.

The invention claimed is:

1. A push-pull bridge magnetic sensor, the sensor comprising:
   a push-arm substrate and a pull-arm substrate in an XY plane;
   at least one push-arm consisting of one or more electrically interconnected magnetoresistive sense elements and at least one pull-arm consisting of one or more electrically interconnected magnetoresistive sense elements; and
   at least two push-arm flux concentrators and at least two pull-arm flux concentrators;

wherein long-axis directions of the push-arm flux concentrators and the pull-arm flux concentrators are aligned along a Y-axis direction, and short-axis directions thereof are aligned along an X-axis direction;

wherein the magnetoresistive sense elements on the push-arm are located in the gaps between two adjacent push-arm flux concentrators, and the magnetoresistive sense elements on the pull-arm are located in the gaps between two adjacent pull-arm flux concentrators;

wherein the push-arm and the push-arm flux concentrators are deposited on the push-arm substrate, and the pull-arm and the pull-arm flux concentrators are deposited on the pull-arm substrate;

wherein the push-arm and the pull-arm are electrically interconnected to form a bridge;

wherein magnetization directions of magnetic pinning layers of the magnetoresistive sense elements on the push-arm substrate are the same, and magnetization directions of magnetic pinning layers of the magnetoresistive sense elements on the pull-arm substrate are the same; and the magnetization directions of the magnetic pinning layers of the magnetoresistive sense elements on the push-arm substrate are opposite to the magnetization directions of the magnetic pinning layers of the magnetoresistive sense elements on the pull-arm substrate; and wherein sense directions of the magnetoresistive sense elements on the push-arm and the pull-arm are the X-axis direction.

2. The push-pull bridge magnetic sensor according to claim 1, wherein at most one column of the magnetoresistance sense elements are arranged respectively in a gap between every two adjacent push-arm flux concentrators and a gap between every two adjacent pull-arm flux concentrators.

3. The push-pull bridge magnetic sensor according to claim 1, wherein the magnetoresistive sense elements are GMR or TMR sense elements.

4. The push-pull bridge magnetic sensor according to claim 1, wherein, for the push-arm substrate and the pull-arm substrate, the magnetization directions of the pinning layers of the magnetoresistive sense elements on one substrate are an X-axis positive direction and the magnetization directions of the pinning layers of the magnetoresistive sense elements on the other substrate are an X-axis negative direction.

5. The push-pull bridge magnetic sensor according to claim 4, wherein, when no externally applied magnetic field exists, the magnetoresistive sense elements can bias magnetization directions of magnetic free layers through on-chip permanent magnets, on-chip coils, double-exchange interaction, shape anisotropy or a combination of at least two of them, and directions of crossed bias fields produced by the on-chip permanent magnets and the on-chip coils are the Y-axis direction.

6. The push-pull bridge magnetic sensor according to claim 1, wherein the bridge is a half-bridge, a full-bridge or a quasi-bridge.

7. The push-pull bridge magnetic sensor according to claim 1, wherein the magnetoresistive sense elements on the push-arm and the pull-arm are the same in number and are mutually parallel.

8. The push-pull bridge magnetic sensor according to claim 1, wherein the push-arm flux concentrators and the pull-arm flux concentrators are the same in number and are mutually parallel.

9. The push-pull bridge magnetic sensor according to claim 1, wherein the push-arm flux concentrators and the pull-arm flux concentrators are arrays of slender bars and are consisted of a material which is soft ferromagnetic alloy, the soft ferromagnetic alloy containing one or more elements of Ni, Fe and Co.

10. The push-pull bridge magnetic sensor according to claim 1, wherein a gain coefficient Asns of magnetic fields at the positions of the magnetoresistive sense elements on the push-arm and the pull-arm is greater than 1.

11. The push-pull bridge magnetic sensor according to claim 1, wherein the push-arm substrate and the pull-arm substrate comprise an integrated circuit or are connected with other substrates comprising an integrated circuit.

12. The push-pull bridge magnetic sensor according to claim 11, wherein the integrated circuit is CMOS (Complementary Metal Oxide Semiconductor), BiCMOS (Bipolar Complementary Metal Oxide Semiconductor), Bipolar, BCDMOS (Bipolar/CMOS/DMOS) or SOI (Semiconductor On Insulator or Silicon On Insulator), the push-arm is directly deposited on top of the integrated circuit on the push-arm substrate, and the pull-arm is directly deposited on top of the integrated circuit on the pull-arm substrate.

13. The push-pull bridge magnetic sensor according to claim 1, wherein the substrates are ASIC chips comprising any one or more application circuits of an offset circuit, a gain circuit, a calibration circuit, a temperature compensation circuit and a logic circuit.

14. The push-pull bridge magnetic sensor according to claim 13, wherein the logic circuit is a digital switching circuit or a rotation angle calculating circuit.

* * * * *